United States Patent
Xiao et al.

(10) Patent No.: US 7,084,632 B2
(45) Date of Patent: Aug. 1, 2006

(54) PERMANENT MAGNET FOR MAGNET RESONANCE

(75) Inventors: Shengqian Xiao, Shen Yang (CN); Shijie Zhao, Shen Yang (CN); Guangran Chen, Shen Yang (CN)

(73) Assignee: Shenyang Neusoft Bopu NMR Tech Co., Ltd., Shen Yang (CN)

( * ) Notice: Subject to any disclaimer, the term of this patent is extended or adjusted under 35 U.S.C. 154(b) by 0 days.

(21) Appl. No.: 10/509,573

(22) PCT Filed: Mar. 28, 2003

(86) PCT No.: PCT/CN03/00229

§ 371 (c)(1),
(2), (4) Date: Sep. 29, 2004

(87) PCT Pub. No.: WO03/082106

PCT Pub. Date: Oct. 9, 2003

(65) Prior Publication Data

US 2005/0253585 A1    Nov. 17, 2005

(30) Foreign Application Priority Data

Apr. 1, 2002   (CN) ................. 02 2 10965

(51) Int. Cl.
*G01V 3/00* (2006.01)
*H01F 7/02* (2006.01)

(52) U.S. Cl. .............. 324/319; 324/320; 335/302; 335/304

(58) Field of Classification Search .............. 335/306, 335/216, 296, 298; 324/318–320; 378/63
See application file for complete search history.

(56) References Cited

U.S. PATENT DOCUMENTS

| | | | |
|---|---|---|---|
| 5,315,276 A * | 5/1994 | Huson et al. | 335/216 |
| 5,431,165 A * | 7/1995 | Sellers | 600/422 |
| 5,623,241 A * | 4/1997 | Minkoff | 335/296 |
| 5,729,188 A * | 3/1998 | Siebold et al. | 335/298 |
| 5,818,901 A * | 10/1998 | Schulz | 378/63 |
| 5,864,275 A * | 1/1999 | Ohashi et al. | 335/306 |
| 5,963,117 A * | 10/1999 | Ohashi et al. | 335/306 |
| 6,023,165 A * | 2/2000 | Damadian et al. | 324/318 |
| 6,150,818 A * | 11/2000 | Barber | 324/319 |
| 6,150,819 A * | 11/2000 | Laskaris et al. | 324/319 |
| 6,211,676 B1 * | 4/2001 | Byrne et al. | 324/319 |
| 6,259,252 B1 * | 7/2001 | Laskaris et al. | 324/319 |
| 6,335,623 B1 * | 1/2002 | Damadian et al. | 324/320 |
| 6,842,002 B1 * | 1/2005 | Cheng et al. | 324/318 |
| 2003/0001575 A1 * | 1/2003 | Cheng et al. | 324/318 |

FOREIGN PATENT DOCUMENTS

| | | |
|---|---|---|
| CN | 1102971 A | 5/1995 |
| CN | 2296694 Y | 11/1998 |
| CN | 1252977 A | 5/2000 |
| CN | 2397891 Y | 9/2000 |
| CN | 2481283 Y | 3/2002 |
| EP | WO 01/53847 A1 * | 7/2001 |

* cited by examiner

Primary Examiner—Diego Gutierrez
Assistant Examiner—Tiffany A. Fetzner
(74) Attorney, Agent, or Firm—Browdy and Neimark, PLLC

(57) ABSTRACT

The present invention discloses a permanent magnet for magnetic resonance, which is used for a magnetic resonance imaging apparatus for medical diagnosis. The permanent magnet of the present comprises permanent magnetic material; pole heads; plates for eliminating vortex (i.e. eddy currents); rings for homogenizing the magnetic field; gradient coils; and a yoke, said yoke of the permanent magnet has an integral and substantially C-shaped structure formed with two columns and is an open type configuration. This invention fully ensures the parallelism of the lower and upper poles, greatly improves the mechanical strength of the yoke, and results in a good magnetic uniformity and a consistent magnetic current.

4 Claims, 2 Drawing Sheets

PERMANENT MAGNET FOR MAGNET RESONANCE

BACKGROUND OF THE INVENTION

1. Field of the Invention

The present invention generally relates to a medical apparatus, and more particularly to a permanent magnet used for magnetic resonance imaging for medical diagnosis.

2. Brief Description of the Prior Art

The magnetic resonance imaging apparatus is a medical apparatus developed in 1980's, and the most advanced clinical diagnosis apparatus for diagnosing pre-cancer and other diseases. The magnet is a key part of the magnetic resonance imaging apparatus, the SNR (signal-to-noise ratio) of the magnetic resonance imaging apparatus has a direct relation to the performance of the magnet, so that performance of the magnet determines the quality of the image to a certain extent. The permanent magnet has a simple structure without additional means and is convenient to maintain, can be operated safely, and the area of the stray magnetic field there around is small. Therefore, the scientific, technological and medical professionals pay more and more regard to the magnetic resonance imaging apparatus using a permanent magnet.

However, the conventional box-shape permanent magnet formed of ferrite magnetic material is low in magnetic intensity, heavy, large in volume, closed and poor in practicability. In the early stage, weight of a magnet of 3000 Gs was substantially 100 tons, so that it was difficult to transport and mount the magnet. Subsequently, a new magnetic material, i.e. NdFeB, was developed, and many countries have invested a lot of work and money in research and development of the magnetic resonance permanent magnet having low field strength. Recently, there has been proposed a magnet of so-called open type, which has high magnetic energy product, good uniformity, and small volume. This type of magnet has the following advantages: a patient can lie on a half-open examining table, thus eliminating the patient's dread occurring in the conventional MRI examination, so that it is easily acceptable for children or other apprehensive patients. In addition, during the MRI examination, the patient is not required to lie on or lie face down on the examining table, and may be seated on the table so that they may be examined on a part of the body thereof such as the extremities. In addition, it is possible to provide interventional therapy to the patient. Therefore, this type of magnet has developed rapidly and a lot of products are available on the market. Since this type of magnet is cheap, the market share thereof has increased gradually. However, the above conventional products have a separated structure, the yoke part of the magnet is formed by a plurality of portions assembled to each other. Therefore, it is difficult to ensure parallelism of the upper yoke to the lower yoke during manufacturing and assembling, thus deteriorating the performance of the magnet to a certain extent, more particularly, decreasing the mechanical strength of the magnet and affecting the uniformity of the magnetic circuit.

SUMMARY OF THE INVENTION

Accordingly, in order to solve problems occurring in the conventional magnets formed by a plurality of parts assembled to each other, an object of the present invention is to provide an open-type permanent magnet for magnetic resonance, which has a substantially C-shaped structure with two columns.

The above object is accomplished by providing a permanent magnet comprising: a yoke, magnetic materials, pole heads, plates for eliminating vortex (i.e. eddy currents), rings for homogenizing magnetic field, and gradient coils. The yoke of the present invention is integrally formed by casting, has a substantially C-shaped and open structure with two columns, the magnetic material is adhesive bonded to the yoke, the pole heads are adhesive bonded to the yoke, plates for eliminating vortex (i.e. eddy currents) are adhesive bonded to the pole heads respectively, and the gradient coils and rings for homogenizing magnetic field are mounted to the pole heads respectively, with the gradient coils located inside and the rings for homogenizing magnetic field located outside, each of the rings for homogenizing the magnetic field is respectively formed of a plurality of arc sections fixed to the pole heads so as to form a ring.

The magnet of the present invention is integrally formed by casting, which has a substantially C-shaped and open structure with two columns, so that it is simply in a single structure. The magnetic circuit thereof is designed by two-dimensional or three-dimensional simulation using a computer, the magnetic material is formed of consubstantial NdFeB using a series of high and new-technologies and processes, thus ensuring good uniformity and stability, small area of the stray magnetic field, and eliminating substantially vortex effect (i.e. eddy currents). The yoke part of the present invention is formed integrally of low carbon steel by casting, the material forming the yoke part is uniform, the crystal grains of the yoke part are uniform and consistent as a result of annealing the material forming the yoke part twice, thus eliminating the internal stress completely. The defects in the yoke part can be eliminated by magnetic particle and ultrasonic inspection, so that the parallelism of the lower yoke to the upper yoke can be ensured to the maximum extent, thus increasing mechanical strength of the yoke frame and ensuring uniformity of the magnetic field and fluency of the magnetic circuit. At the same time, the yoke frame is designed as a streamline shape and thereby meets the requirements of the design principle of the magnetic circuit of the magnet, so that the magnet is light, has low flux leakage and good appearance. The magnet of the present invention employs NdFeB as the magnetic material having high performance, thus increasing uniformity of the magnet and eliminating the vortex (i.e. eddy current) effect generally occurring in conventional permanent magnets. The base magnetic field is good, so that the magnetic field can be homogenized easily.

Figure 2:
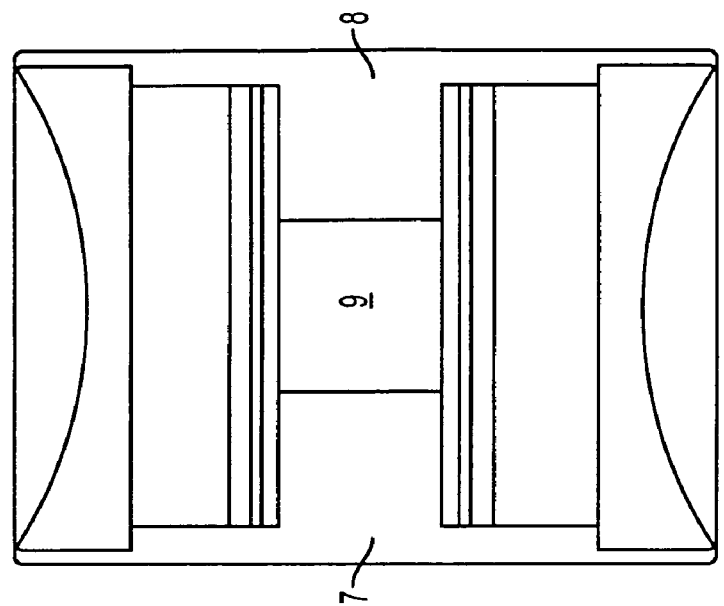
FIG. 2 is a side view of the FIG. 1.

reference numerals 1: a yoke; 2: magnetic material; 3: pole head; 4: plate for eliminating vortex, (i.e. eddy currents); 5: field-homogenizing ring; 6: gradient coil.

Figure 1:
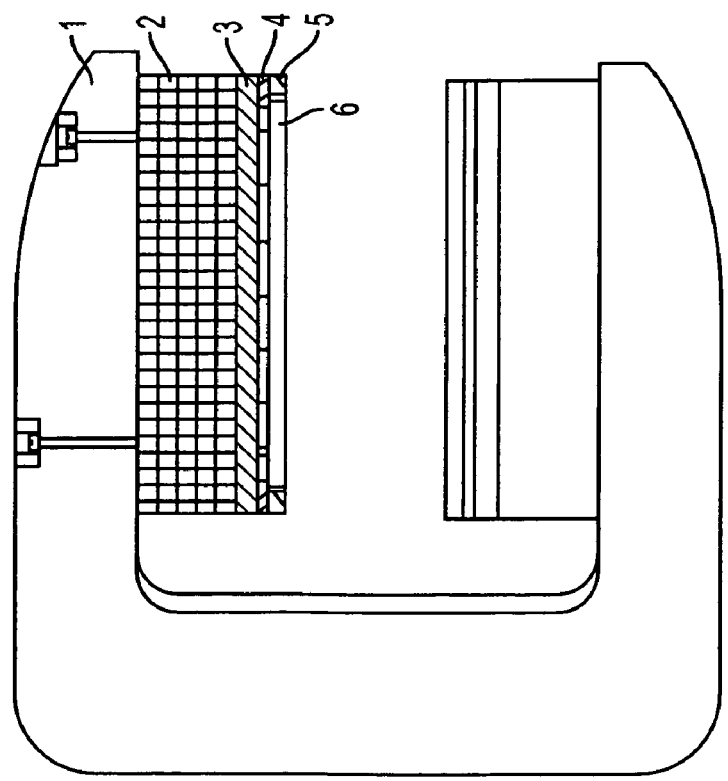
FIG. 1 is a schematic view of the integral structure of the magnet according to one embodiment of the present invention.
Figure 3:
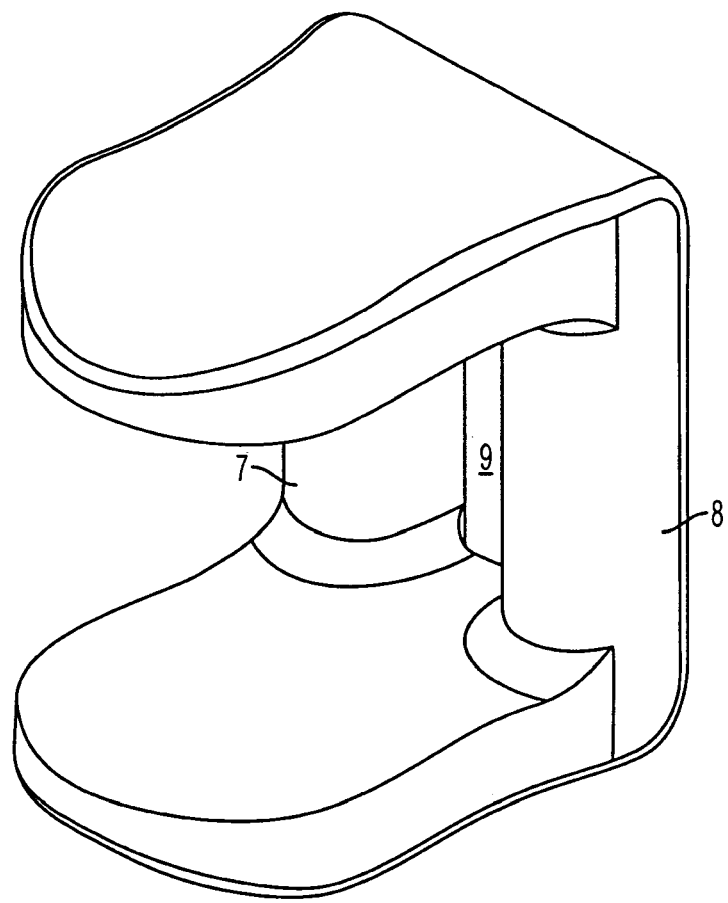

FIG. 3 is a perspective view of the yoke of the magnet of FIGS. 1 and 2.

DETAILED DESCRIPTION OF THE PREFERRED EMBODIMENTS OF THE INVENTION

As shown in FIGS. 1, 2 and 3, the magnet of the present invention comprises a yoke 1, magnetic material 2, pole heads 3, plates for eliminating vortex 4, rings 5 for homogenizing magnetic field, and gradient coils 6. The yoke 1 has an integral, substantially C-shaped and opened structure with two columns 7 and 8 separated by an opening 9. The magnetic material 2 is adhesively bonded to the yoke 1, the pole heads 3 are adhesively bonded to the magnetic material 2 respectively, the plates for eliminating vortex 4 are adhesively bonded to the pole heads 3 respectively, the gradient coils 6 and rings 5 for homogenizing magnetic field are fixed to the pole heads 3 by screws, respectively.

The technical indicators of the magnet according to the present invention are provided in the following table:

| type | 2300 | 3500 |
|---|---|---|
| magnetic field intensity | 2300 Gs ± 50 Gs | 3500 Gs ± 50 Gs |
| magnetic field direction | vertical | vertical |
| height of air gap | 525 mm | 525 mm |
| material | NdFeB | NdFeB |
| structure | open | open |
| 5Gs line | ≦1.8 m | ≦2.2 m |
| uniformity of magnetic field | ≦20 ppm in 30 DSV | ≦20 ppm in 30 DSV |
| homogenizing manner | passive | passive |
| stability | 6 ppm/h | 6 ppm/h |
| operating condition | 21 ± 1° C. | 21 ± 1° C. |

What is claimed is:

1. A permanent magnet producing a magnetic field configured for magnetic resonance, comprising:
   permanent magnetic material;
   pole heads;
   plates configured for eliminating vortex (i.e. eddy currents);
   rings configured for homogenizing the magnetic field;
   gradient coils; and
   a yoke, wherein said yoke of the permanent magnet has:
      an integral, substantially C-shaped and open structure formed with two columns, said yoke is integrally manufactured by casting, and
      wherein said yoke is annealed twice.

2. The permanent magnet configured for magnetic resonance according to claim 1, wherein said yoke is formed of low carbon steel material having good magnetic conductivity.

3. The permanent magnet configured for magnetic resonance according to claim 1, wherein said yoke is designed so as to have a streamline-shape appearance.

4. The permanent magnet configured for magnetic resonance according to claim 2, wherein said yoke is designed so as to have a streamline-shape appearance.

* * * * *